(12) United States Patent
Ohnuma

(10) Patent No.: US 8,227,302 B2
(45) Date of Patent: Jul. 24, 2012

(54) SEMICONDUCTOR DEVICE, ELECTRONIC DEVICE, AND MANUFACTURING METHOD THEREOF

(75) Inventor: Hideto Ohnuma, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 262 days.

(21) Appl. No.: 12/425,512

(22) Filed: Apr. 17, 2009

(65) Prior Publication Data
US 2009/0267151 A1 Oct. 29, 2009

(30) Foreign Application Priority Data
Apr. 25, 2008 (JP) .................... 2008-115008

(51) Int. Cl.
*H01L 21/00* (2006.01)

(52) U.S. Cl. . 438/151; 438/595; 257/351; 257/E21.116; 257/E21.64

(58) Field of Classification Search .................. 438/596, 438/45, 48, 413, 147, 174, 595, 151; 257/E21.116, 257/E21.704, E21.262, E21.64, 351, E21.631, 257/E21.531, E29.347, E27.112; 216/23, 216/46, 72
See application file for complete search history.

(56) References Cited

U.S. PATENT DOCUMENTS

| | | |
|---|---|---|
| 4,072,545 A | 2/1978 | De La Moneda |
| 5,079,180 A | 1/1992 | Rodder et al. |
| 5,250,454 A | 10/1993 | Maszara |
| 5,583,366 A | 12/1996 | Nakazawa |
| 5,828,103 A | 10/1998 | Hsu |
| 6,063,675 A | 5/2000 | Rodder |
| 6,306,712 B1 | 10/2001 | Rodder et al. |
| 6,335,231 B1 | 1/2002 | Yamazaki et al. |
| 6,429,084 B1 * | 8/2002 | Park et al. ...................... 438/305 |
| 6,743,666 B1 | 6/2004 | Chan |
| 6,946,371 B2 * | 9/2005 | Langdo et al. ................ 438/481 |
| 7,122,452 B2 | 10/2006 | Pawlak |
| 7,238,557 B2 | 7/2007 | Hayakawa |
| 7,247,562 B2 | 7/2007 | Ishikawa |
| 7,692,194 B2 | 4/2010 | Yamazaki et al. |
| 7,772,054 B2 | 8/2010 | Ohnuma |

(Continued)

FOREIGN PATENT DOCUMENTS

JP 61-048975 A 3/1986

(Continued)

OTHER PUBLICATIONS

He.S et al., "Raised Source and Drain Structure of Poly-Si TFTS.", Electrochemical Society Proceedings, 1990, vol. 98-22, pp. 204-220.

*Primary Examiner* — Caridad Everhart
(74) *Attorney, Agent, or Firm* — Nixon Peabody, LLP; Jeffrey L. Costellia

(57) ABSTRACT

To provide a semiconductor device in which resistance of a source region and a drain region of a thin film transistor is reduced and a short channel effect is suppressed, and a manufacturing method thereof. The semiconductor device includes a gate electrode which is formed over a first semiconductor layer with a gate insulating film interposed therebetween; sidewalls which are formed on side surfaces of the gate electrode; and second semiconductor layers which are in contact with and stacked over end portions of the sidewalls and the first semiconductor layer, wherein the second semiconductor layers cover at least a part of the end portions of the sidewalls.

22 Claims, 14 Drawing Sheets

U.S. PATENT DOCUMENTS

| | | | |
|---|---|---|---|
| 2001/0052598 A1* | 12/2001 | Koga et al. | 257/59 |
| 2002/0001921 A1* | 1/2002 | Fukunaga | 438/455 |
| 2005/0136606 A1* | 6/2005 | Rulke et al. | 438/305 |
| 2007/0252210 A1 | 11/2007 | Ishikawa | |
| 2008/0001218 A1* | 1/2008 | Kim et al. | 257/330 |
| 2008/0318374 A1* | 12/2008 | Chu et al. | 438/211 |
| 2009/0020815 A1 | 1/2009 | Godo | |
| 2009/0101906 A1 | 4/2009 | Hosoya et al. | |
| 2010/0279477 A1 | 11/2010 | Ohnuma | |

FOREIGN PATENT DOCUMENTS

JP     05-110099 A     4/1993

* cited by examiner

SEMICONDUCTOR DEVICE, ELECTRONIC DEVICE, AND MANUFACTURING METHOD THEREOF

BACKGROUND OF THE INVENTION

1. Field of the Invention

The present invention relates to a semiconductor device, a manufacturing method thereof, and an electronic device including the semiconductor device.

2. Description of the Related Art

A thin film transistor (TFT) is a transistor formed using a semiconductor. In recent years, in order to improve performance of a semiconductor device, various technologies have been examined in accordance with increasing in integration degree of thin film transistors and downsizing of semiconductor devices using a thin film transistor.

With downsizing of semiconductor devices, parasitic resistance between a source region and a drain region of a thin film transistor cannot be ignored, and sheet resistance is increased.

When the sheet resistance of the source region and the drain region is increased, a problem arises in that current drive capability is deteriorated in a semiconductor device which is manufactured.

In order to solve the forgoing problem, with respect to a thin film transistor, a technique has been developed in which a high-concentration impurity layer is stacked over a semiconductor layer and only the high-concentration impurity layer is etched not to promote etching of a lower semiconductor layer using difference in etching rate between the two layers in dry etching (Non-Patent Document 1: "Raised source and drain structure of poly-Si TFTs" Electrochemical Society Proceeding).

By using this technique, a thin film transistor in which resistance of a source region and a drain region is lowered can be manufactured using a stacked portion of a semiconductor layer and a high-concentration impurity layer for the source region and the drain region.

SUMMARY OF THE INVENTION

In Non-Patent Document 1, since a polycrystalline semiconductor layer has a large thickness of 100 nm, it is possible to perform etching with the polycrystalline semiconductor layer left using the difference in etching rate between the polycrystalline semiconductor layer and a high-concentration impurity layer.

However, when a channel length (the length of a channel formation region in a direction in which carriers flow) of a thin film transistor is reduced in accordance with downsizing of semiconductor devices, leakage current increases and the subthreshold swing (S value) of the thin film transistor increases (a short channel effect). That is, switching characteristics of the thin film transistor are deteriorated.

In order to suppress a short channel effect the polycrystalline semiconductor layer including the channel formation region of the thin film transistor should be thinly formed to have a thickness of less than or equal to 100 nm, particularly, less than or equal to 40 nm.

When the polycrystalline semiconductor layer has a thickness of less than or equal to 40 nm, it is difficult to perform etching with the polycrystalline semiconductor layer left as in Non-Patent Document 1, and it is extremely difficult to prevent the polycrystalline semiconductor layer from being removed regardless of the magnitude of the difference in etching rate.

In view of the foregoing, an object to be disclosed is to provide a semiconductor device in which sheet resistance of a source region and a drain region is reduced, a short channel effect is suppressed, and a semiconductor layer is prevented from being removed.

A semiconductor device to be disclosed includes: a first semiconductor layer formed over an insulator; a gate insulating film formed over the first semiconductor layer; a gate electrode formed over the gate insulating film; sidewalls formed in contact with side surfaces of the gate electrode; and second semiconductor layers which are in contact with and stacked over the first semiconductor layer and which are formed to be in contact with or cover a part of the sidewalls.

A semiconductor device includes: a first semiconductor layer formed over an insulator; a gate insulating film formed over the first semiconductor layer; a gate electrode formed over the gate insulating film; sidewalls formed in contact with side surfaces of the gate electrode; and second semiconductor layers which are in contact with and stacked over end portions of the sidewalls extended over the first semiconductor layer and the first semiconductor layer and which are formed to be in contact with or cover at least a part of the end portions of the sidewalls.

Here, the end portions of the sidewalls which are extended are a part of the sidewalls, and the second semiconductor layers are considered to cover a part of the sidewalls even when the second semiconductor layers are formed to cover the end portions.

Here, the second semiconductor layers are formed to be in contact with at least a part of the sidewalls, and have a structure in which a top surface of the first semiconductor layer is prevented from being exposed between the sidewalls and the second semiconductor layers.

A semiconductor device is provided with a channel formation region and a source region and a drain region in a first semiconductor layer, and low-concentration impurity (also referred to as a light doped drain: LDD) regions between the channel formation region and the source region or the drain region, and high-concentration impurity regions at portions where the first semiconductor layer and the second semiconductor layers are stacked.

A semiconductor device is provided with an insulating layer covering a top surface of the gate electrode.

A method for manufacturing a semiconductor device to be disclosed includes the steps of: forming a first semiconductor layer over an insulator; forming a gate insulating film and a gate electrode which are stacked over the first semiconductor layer in this order; adding an impurity element imparting one conductivity to the first semiconductor layer using the gate electrode as a mask to form low-concentration impurity regions; forming sidewalls on side surfaces of the gate electrode; forming a semiconductor film covering the gate electrode, the sidewalls, and the first semiconductor layer; etching the semiconductor film using a resist mask to form two second semiconductor layers so that the second semiconductor layers are in contact with and stacked over the first semiconductor layer and are in contact with or cover a part of the sidewalls; and adding an impurity element imparting the one conductivity to the two second semiconductor layers to form high-concentration impurity regions.

A method for manufacturing a semiconductor device includes the steps of: forming a first semiconductor layer over an insulator; forming a gate insulating film and a gate electrode which are stacked over the first semiconductor layer in this order; adding an impurity element imparting one conductivity to the first semiconductor layer using the gate electrode as a mask to form low-concentration impurity regions; forming sidewalls which are in contact with side surfaces of the gate electrode and of which end portions are extended over the first semiconductor layer; forming a semiconductor film covering the gate electrode, the sidewalls, the end portions of the sidewalls, and the first semiconductor Layer; etching the semiconductor film using a resist mask to form two second semiconductor layers so that the second semiconductor layers are in contact with and stacked over the first semiconductor layer and are in contact with or cover at least a part of the end portions; and adding an impurity element imparting the one conductivity to the two second semiconductor layers to form high-concentration impurity regions.

A method for manufacturing a semiconductor device includes the steps of: forming a first semiconductor layer over an insulator; forming a gate insulating film, a gate electrode, and an insulating layer which are formed over the first semiconductor layer in this order; adding an impurity element imparting one conductivity to the first semiconductor layer using the gate electrode as a mask to form low-concentration impurity regions; forming sidewalls on side surfaces of the gate electrode; forming a semiconductor film covering the insulating layer, the sidewalls, and the first semiconductor layer; etching the semiconductor film using a resist mask to form two second semiconductor layers so that the second semiconductor layers are in contact with and stacked over the first semiconductor layer and are in contact with or cover at least a part of the sidewalls; and adding an impurity element imparting the one conductivity to the two second semiconductor layers to form high-concentration impurity regions.

A method for manufacturing a semiconductor device includes the steps of: forming a first semiconductor layer over an insulator; forming a gate insulating film, a gate electrode, and an insulating layer which are stacked over the first semiconductor layer in this order; adding an impurity element imparting one conductivity to the first semiconductor layer using the gate electrode as a mask to form low-concentration impurity regions; forming sidewalls on side surfaces of the gate electrode; forming a semiconductor film covering the insulating layer, the sidewalls, and the first semiconductor layer; forming a negative resist covering the semiconductor film; forming a resist mask by performing light exposure from the rear surface side of the insulator to the negative resist using the gate electrode as a mask; etching the semiconductor film using the resist mask; patterning the etched semiconductor film to form two second semiconductor layers so that the second semiconductor layers are in contact with and stacked over the first semiconductor layer and are in contact with or cover at least a part of the sidewalls; and adding an impurity element imparting the one conductivity to the two second semiconductor layers to form high-concentration impurity regions.

That is, a semiconductor device obtained by a manufacturing method to be disclosed is formed so that a first semiconductor layer and second semiconductor layers are stacked and the thickness of the stacked portion is larger than the thickness of a portion which is in the first semiconductor layer and overlaps with a gate electrode.

Further, the second semiconductor layers are formed covering a part of sidewalls.

By forming a channel formation region in a semiconductor layer which is thinned, a short channel effect can be suppressed, and S value can be reduced. Further, a source region and a drain region are formed in a stacked portion of the semiconductor layer and high-concentration impurity layers to thicken the source region and the drain region; thus, sheet resistance between the source region and the drain region can be reduced.

By employing a structure in which a part of sidewalls formed on side surfaces of the gate electrode and the high-concentration impurity layers overlap with each other, a semiconductor device in which the semiconductor layer is prevented from being removed can be provided.

DETAILED DESCRIPTION OF THE INVENTION

Figure 1:
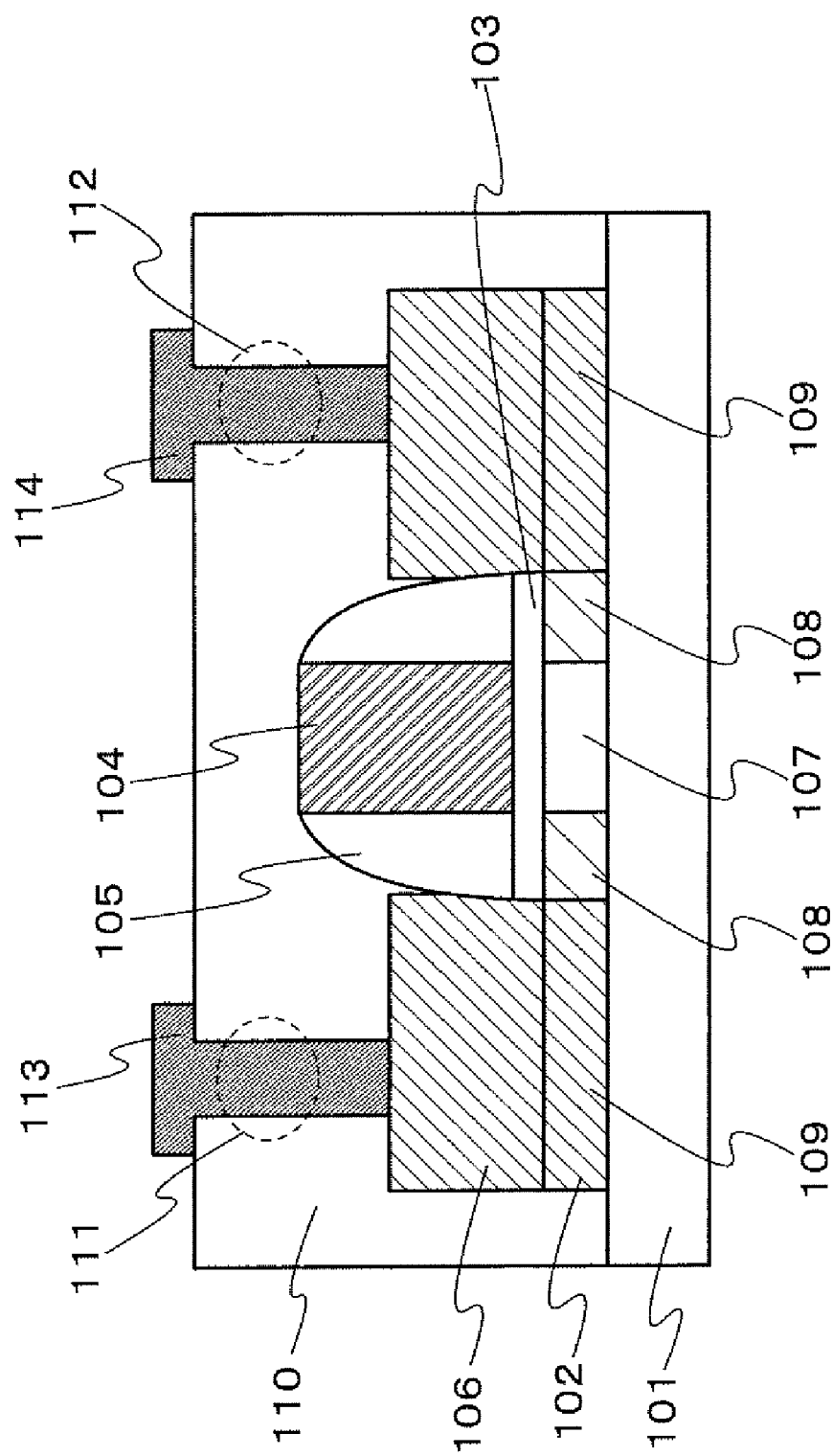
FIG. 1 is a cross-sectional view of a semiconductor device in Embodiment 1.

Hereinafter, embodiments will be described with reference to the drawings. However, the present invention can be carried out in many different modes, and it is easily understood by those skilled in the art that the modes and details can be changed in various ways without departing from the spirit and scope of the present invention. Therefore, the present invention is not interpreted as being limited to the following description of the embodiments.

The following Embodiments 1 to 7 can be combined as appropriate. Parts with the same reference numerals in the drawings can be formed using the same materials and by the same methods unless otherwise noted.

Embodiment 1

In Embodiment 1, an example of an element structure of a semiconductor device is described.

FIG. 1 is a cross-sectional view of a semiconductor device in Embodiment 1.

The semiconductor device illustrated in FIG. 1 includes an insulator 101, a first semiconductor layer 102, a gate insulating film 103, a gate electrode 104, sidewalls 105, second semiconductor layers 106, interlayer insulating films 110, and electrodes 113 and 114.

The sidewalls 105 are formed on side surfaces of the gate electrode 104, and the second semiconductor layers 106 are formed partially covering the sidewalls 105.

The first semiconductor layer 102 includes a channel formation region 107, low-concentration impurity regions 108, and high-concentration impurity regions 109. The thickness of the first semiconductor layer is preferably 10 nm to 40 nm. The first semiconductor layer 102 may have a structure in which the low-concentration impurity regions 108 are not provided.

The gate electrode 104 is formed over the channel formation region 107 with the gate insulating film 103 interposed therebetween, the sidewalls 105 are formed over the low-concentration impurity regions 108 with the gate insulating film 103 interposed therebetween, and the second semiconductor layers 106 are formed over the high-concentration impurity regions 109 to be directly in contact with each other. The thickness of the second semiconductor layers 106 is preferably greater than or equal to 50 nm (desirably, greater than or equal to 100 nm).

An impurity element imparting one conductivity is added at high concentration to the second semiconductor layers 106 and regions in the first semiconductor layer 102, and a source region and a drain region are formed using the high-concentration impurity regions 109 and the second semiconductor layers 106.

That is, a thin film transistor in which the source region and the drain region are formed to be thicker than the channel formation region 107 and the low-concentration impurity regions 108 is manufactured.

Further, the interlayer insulating films 110 are formed covering the thin film transistor, and the electrodes 113 and 114 are electrically connected to the second semiconductor layers 106 through contact holes 111 and 112, which are formed in the interlayer insulating films 110.

Therefore, in a semiconductor device of this embodiment, since the thickness of the first semiconductor layer 102 is small, a short channel effect can be suppressed, and since the thicknesses of the source region and the drain region are large, sheet resistance can be reduced.

Furthermore, since the second semiconductor layers 106 cover the high-concentration impurity regions 109 and parts of the sidewalls 105, in patterning the second semiconductor layers, the first semiconductor layer 102 can be prevented from being removed by the sidewalls 105 serving as etching stoppers.

Figure 4:
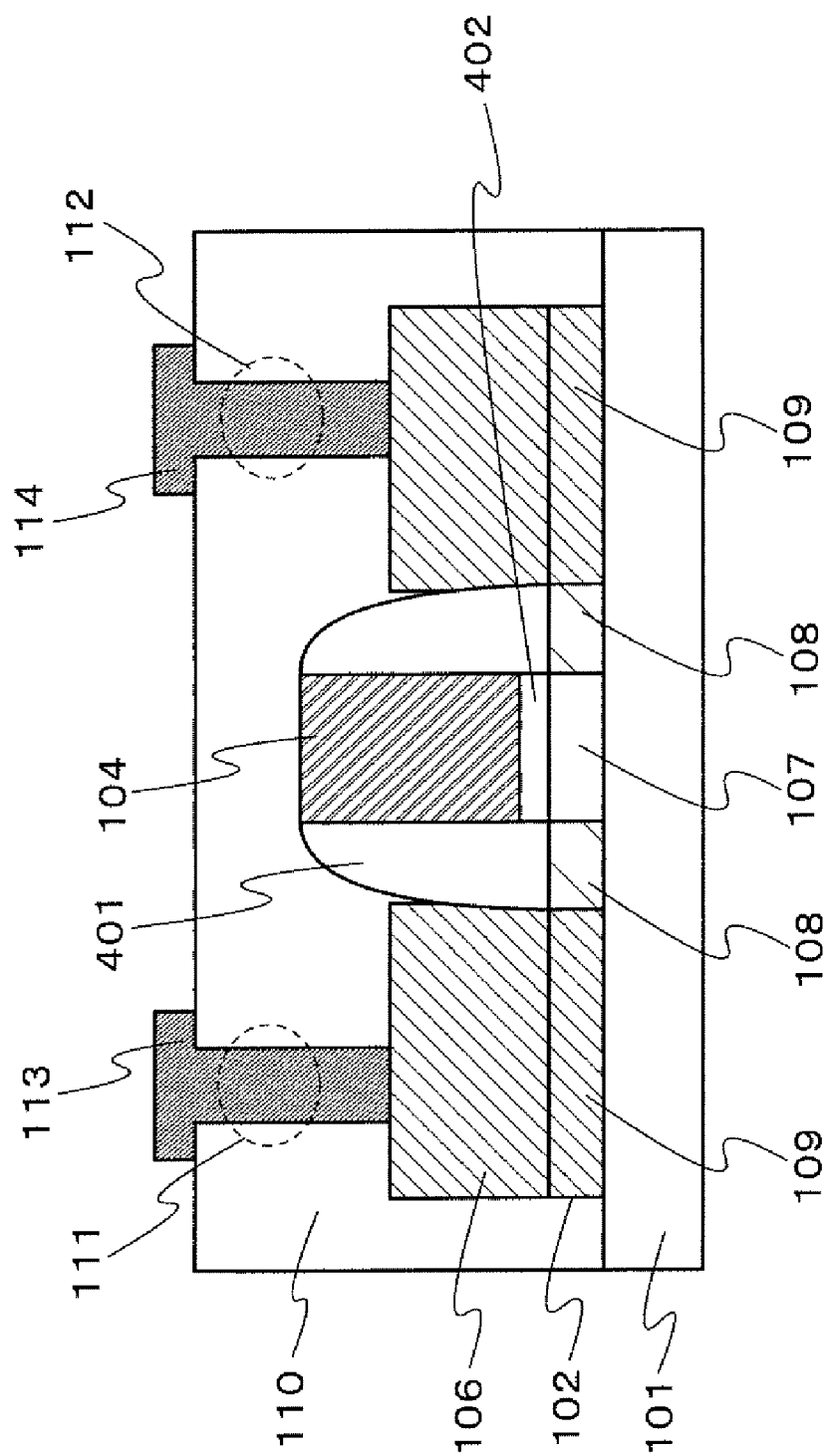
FIG. 4 is a cross-sectional view of a semiconductor device in Embodiment 1.

Note that, in FIG. 1, bottom surfaces of the sidewalls 105 are in contact with the gate insulating film 103; however, as in FIG. 4, a structure in which bottom surfaces of sidewalls 401 are not in contact with a gate insulating film 402 but in contact with the low-concentration impurity regions 108 in the first semiconductor layer 102 may be employed.

Figure 3:
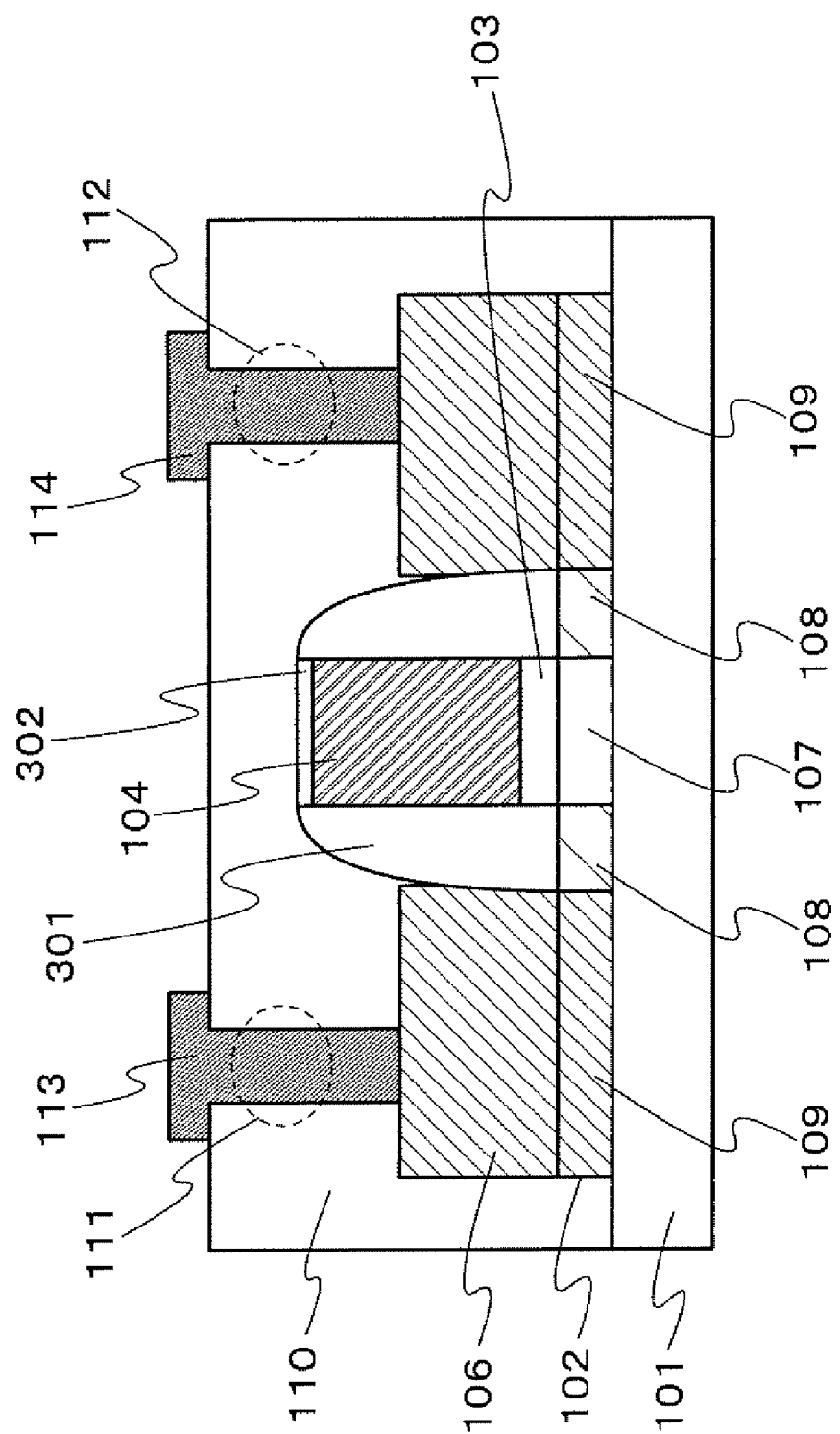
FIG. 3 is a cross-sectional view of a semiconductor device in Embodiment 1.

Further, as in FIG. 3, a structure in which an insulating layer 302 is formed covering a top surface of the gate electrode 104 may be employed.

As in FIG. 3, since the insulating layer 302 covers the top surface of the gate electrode 104, a short circuit between the gate electrode 104 and the second semiconductor layers 106 can be prevented.

The low-concentration impurity regions 108 are not necessarily provided; however, by providing the low-concentration impurity regions 108, effects such as suppression of a short channel effect, improvement of switching characteristics due to reduction in off-state current, and suppression of generation of hot carriers can be obtained. Therefore, a structure in which the low-concentration impurity regions 108 are provided is preferable. Note that, in the case where the low-concentration impurity regions 108 are not provided, an impurity element may be provided at high concentration to regions corresponding to the low-concentration impurity regions.

Embodiment 2

In Embodiment 2, an element structure of a semiconductor device, which is different from that in Embodiment 1, is described.

Figure 2:
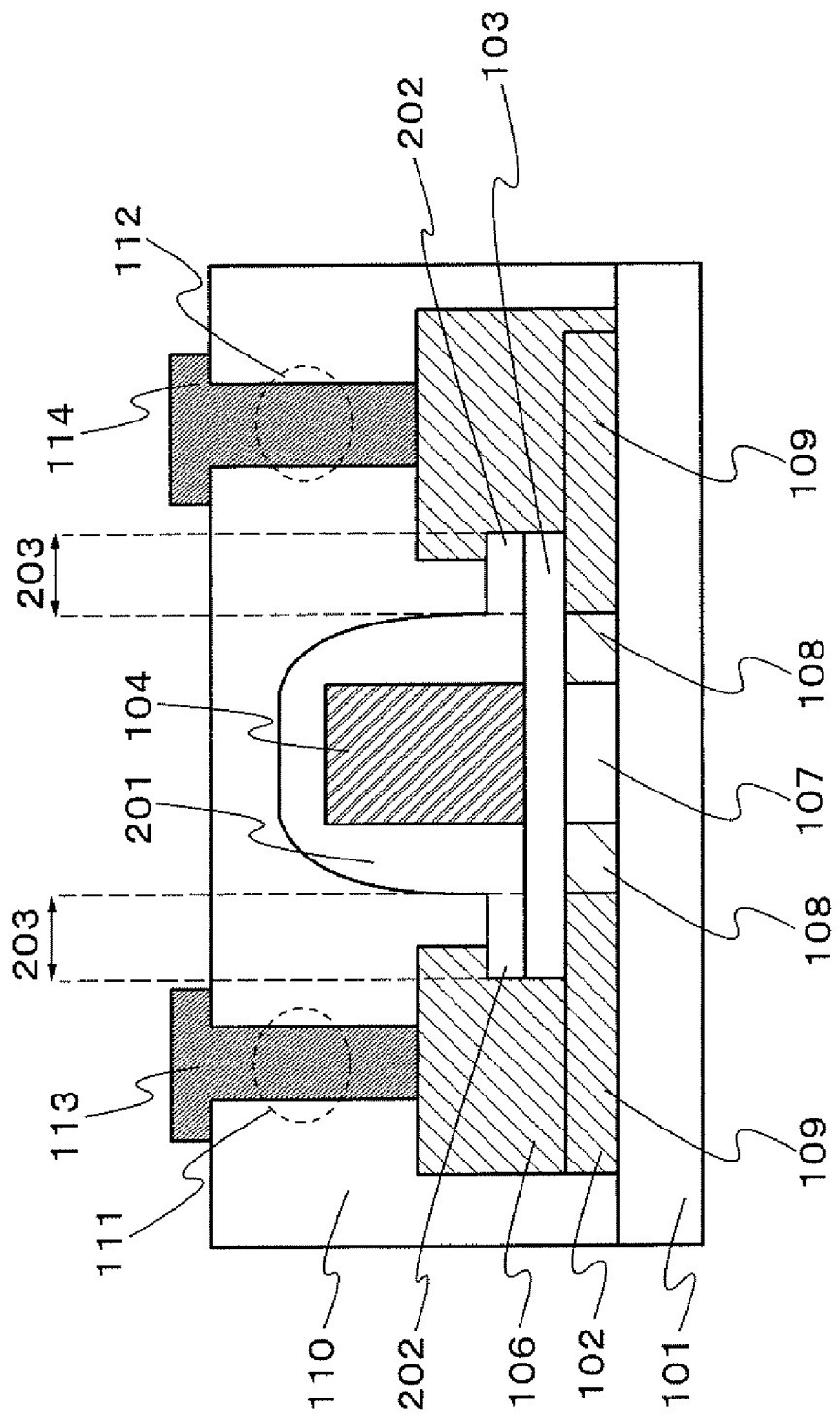
FIG. 2 is a cross-sectional view of a semiconductor device in Embodiment 2.

FIG. 2 is a cross-sectional view of a semiconductor device in Embodiment 2.

In FIG. 2, parts denoted by the same reference numerals as those in FIG. 1 can be formed using the same materials and the same method as those in FIG. 1.

A structure in Embodiment 2 is different from that in Embodiment 1 in that end portions 202 of a sidewall 201 are extended to be overlapped with parts of the first semiconductor layer 102 as illustrated in FIG. 2.

In Embodiment 1 (see FIG. 1), when the second semiconductor layers 106 are formed, in the case where a resist cannot be patterned over the sidewalls 105 because of misalignment of a mask, the first semiconductor layer 102 is partially exposed. At that time, since the thickness of the first semiconductor layer 102 is extremely small, a problem arises in that the first semiconductor layer is removed while the second semiconductor layers 106 are patterned.

Thus, with the element structure in FIG. 2, even when the second semiconductor layers 106 cannot be formed over the sidewall 201 because of misalignment of a mask, by providing a margin of the misalignment of the mask which corresponds to a width 203 of the end portions 202 of the sidewall 201, the first semiconductor layer 102 can be prevented from being removed.

Further, in the semiconductor device of this embodiment, by providing the end portions 202, a distance can be put between the second semiconductor layers 106 and the gate electrode 104; therefore, parasitic capacitance between the gate electrode 104 and the second semiconductor layers 106 can be reduced.

Embodiment 3

In Embodiment 3, a first method for manufacturing a semiconductor device is described with reference to FIGS. 5A to 5D, FIGS. 6A to 6C, and FIGS. 7A and 7B.

Figure 5A:
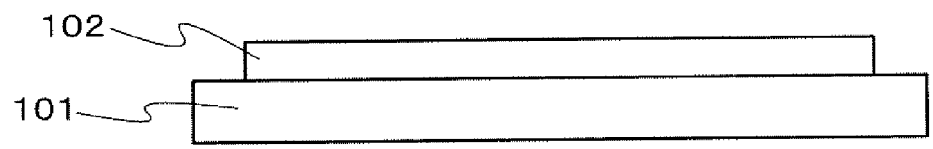
FIGS. 5A to 5D are cross-sectional views illustrating a method for manufacturing a semiconductor device in Embodiment 3.

The first semiconductor layer 102 is formed over the insulator 101. The insulator may be an insulating substrate or may be a base insulating film having a single-layer structure or a stacked-layer structure, which is provided over a substrate (FIG. 5A).

As the insulating substrate, a glass substrate, a quartz substrate, a resin substrate, or the like can be used.

As the base insulating film, a single-layer film or a stacked-layer film of a silicon oxide film, a silicon nitride film, a silicon nitride oxide film in which nitrogen concentration is higher than oxygen concentration, a silicon oxynitride film in which oxygen concentration is higher than nitrogen concentration, a resin film, or the like can be used. The insulator 101 is formed with the base insulating film provided over a semiconductor substrate, a glass substrate, a quartz substrate, a resin substrate, or the like.

The first semiconductor layer 102 is formed by patterning an amorphous semiconductor film, a polycrystalline (microcrystalline is included) semiconductor film, or a single crystal semiconductor film which is formed with silicon, silicon germanium, or the like using a known method such as a CVD method or a sputtering method. Note that the first semiconductor layer 102 may include an impurity element imparting n-type or p-type conductivity.

Further, a crystalline semiconductor having high crystallinity may be formed by performing crystallization with heat or irradiation with light (laser, infrared rays, or the like).

Furthermore, an SOI layer which is formed by a SIMOX method, a bonding method, or the like may be used.

The thickness of the first semiconductor layer 102 is preferably 10 nm to 40 nm in order to suppress adverse effects of a short channel effect on electrical characteristics of a completed thin film transistor.

Figure 5B:
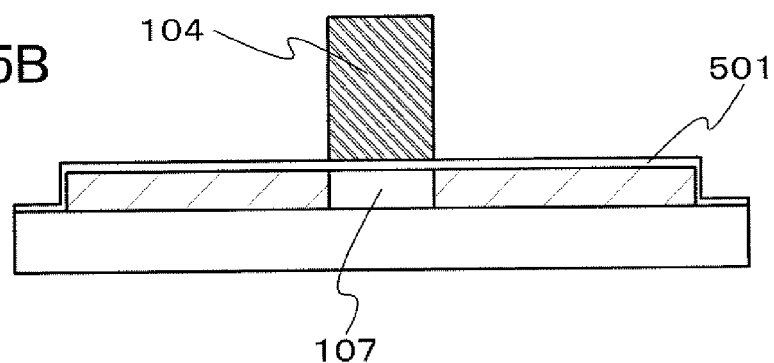

Next, an insulating film 501 which is to be a gate insulating film and has a single-layer structure or a stacked-layer structure is formed over the first semiconductor layer 102, and then a conductive film (not illustrated) which is to be a gate electrode is formed thereover. Then, the conductive film is patterned to form the gate electrode 104 over the first semiconductor layer 102 with the insulating film 501 interposed therebetween (FIG. 5B).

Further an impurity element imparting one conductivity is added to the first semiconductor layer 102 using the gate electrode 104 as a mask, and the channel formation region 107 is formed at a portion in the first semiconductor layer 102 where is overlapped with the gate electrode 104. The impurity element which is added may be either an element imparting p-type conductivity or an element imparting n-type conductivity. In the case where a structure in which an LDD region is not provided in a completed thin film transistor is employed, the impurity element may not be added or the impurity element may be added at high concentration (FIG. 5B).

As the impurity element imparting n-type conductivity, phosphorus, arsenic, or the like can be used. As the impurity element imparting p-type conductivity, boron or the like can be used. The impurity element can be added by ion doping, ion implantation, laser doping, a thermal diffusion method, or the like.

Although an example showing only one element is described for convenience in this embodiment, it is preferable to form a plurality of elements in a plane and employ a CMOS structure in which both an n-type thin film transistor and a p-type thin film transistor are formed.

Note that, in this embodiment the impurity element is added in a state where the insulating film 501 which is to be a gate insulating film is formed, through the insulating film 501; however, the impurity element may be added in a state where the first semiconductor layer 102 is exposed after the insulating film 501 is etched using the gate electrode 104 as a mask to form a gate insulating film. In the case of doping through the insulating film 501, since the insulating film 501 covers the first semiconductor layer 102, damage of the first semiconductor layer 102 due to doping can be reduced.

Figure 5C:
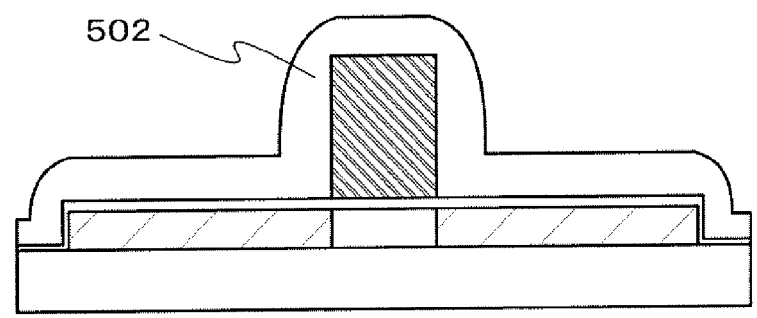

Subsequently, an insulating film 502 having a single-layer structure or a stacked-layer structure, which covers the gate electrode 104 and is to be sidewalls, is formed (FIG. 5C).

As the insulating film 502 which is to be sidewalls, a silicon nitride film, a silicon oxide film, a silicon nitride oxide film in which nitrogen concentration is higher than oxygen concentration, a silicon oxynitride film in which oxygen concentration is higher than nitrogen concentration, or the like can be used. The thickness of the insulating film 502 is preferably 100 nm to 1 μm.

When the insulating film 502 is formed, a step is formed due to the influence of a step of the gate electrode 104.

Figure 5D:
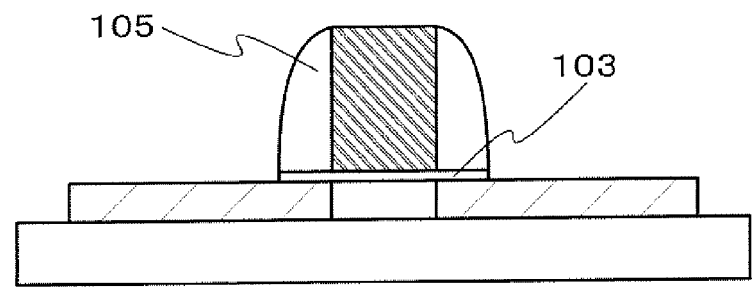

Then, the insulating films 502 and 501 are etched to form the sidewalls 105 which cover side surfaces of the gate electrode 104. By employing an etch back method to form the sidewalls 105, the number of process steps can be reduced as compared to the case of using a mask (FIG. 5D).

When the sidewalls 105 are formed, it is preferable to etch the insulating film 501 which is to be a gate insulating film as well as the insulating film 502 which is stacked thereover and which is to be sidewalls. At this stage, a surface of the first semiconductor layer 102 is exposed, and the gate insulating film 103 is formed. As described above, the gate insulating film may be formed by etching the insulating film 501 using the gate electrode as a mask in a previous process step.

Figure 6A:
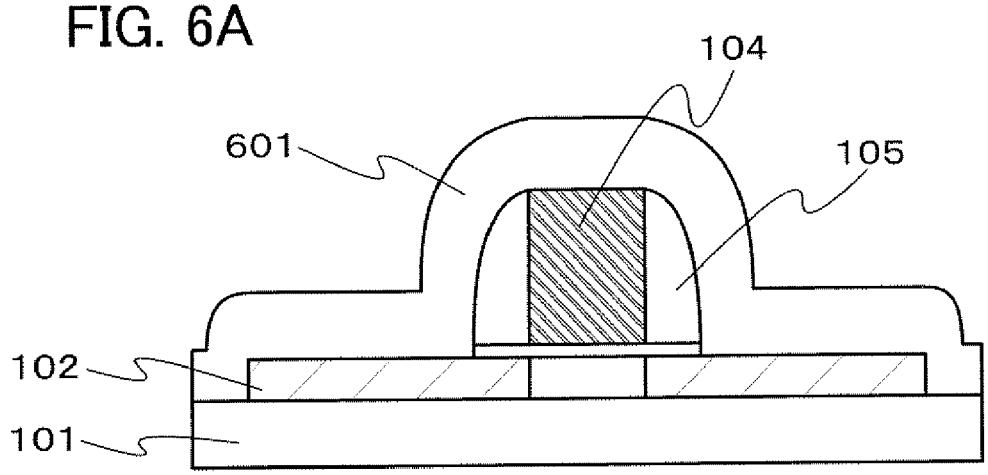
FIGS. 6A to 6C are cross-sectional views illustrating a method for manufacturing a semiconductor device in Embodiment 3.

Then, a semiconductor film 601 which is to be second semiconductor layers is formed covering the sidewalls 105, the first semiconductor layer 102, and the insulator 101 (FIG. 6A).

The thickness of the semiconductor film 601 should be so large that sheet resistance of portions to be a source region and a drain region can be reduced, and is preferably greater than or equal to 50 nm (desirably, greater than or equal to 100 nm).

As the semiconductor film 601, an amorphous semiconductor film, a polycrystalline (microcrystalline is included) semiconductor film, or a single crystal semiconductor film which is formed with silicon, silicon germanium, or the like using a known method such as a CVD method or a sputtering method is used. Note that the semiconductor film 601 may include an impurity element imparting n-type or p-type conductivity to control a threshold value.

Further, a crystalline semiconductor having high crystallinity may be formed by performing crystallization with heat or irradiation with light (laser, infrared rays, or the like).

Figure 6B:
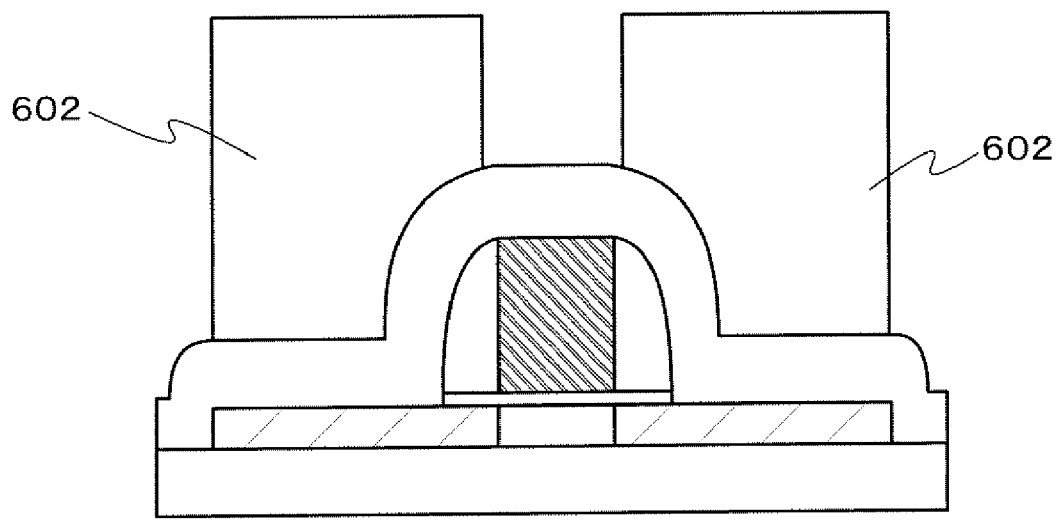

Then, the semiconductor film 601 is etched using a resist mask 602 so that the semiconductor film 601 is divided over the sidewalls 105, and end portions of the semiconductor film 601 are etched so that they are stacked over the first semiconductor layer 102. Thus, two second semiconductor layers 603 which are in contact with the first semiconductor layer 102 are formed. The semiconductor film 601 should be divided so that the gate electrode 104 and the second semiconductor layers 603 are not in contact with each other (FIGS. 6B and 6C).

Figure 6C:
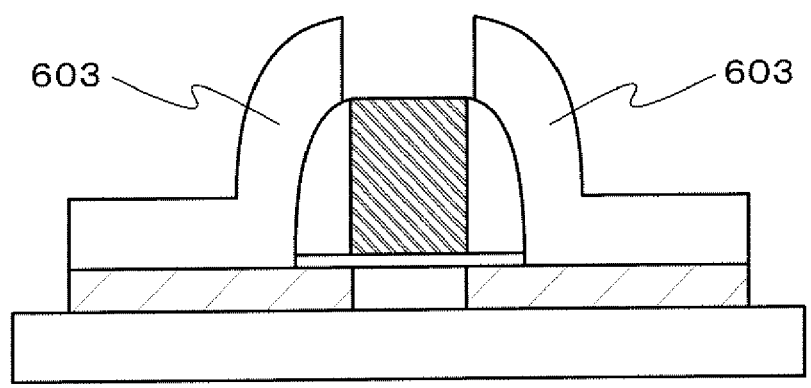

Here, the two second semiconductor layers 603 should be formed partially covering the sidewalls 105 as illustrated in FIG. 6C. Since the sidewalls 105 are partially covered, the sidewalls 105 function as etching stoppers in patterning the second semiconductor layers 603; therefore, a top surface of the first semiconductor layer 102 is not exposed between the sidewalls 105 and the second semiconductor layers 603. Thus, the first semiconductor layer 102 can be prevented from being removed in the patterning.

Figure 7A:
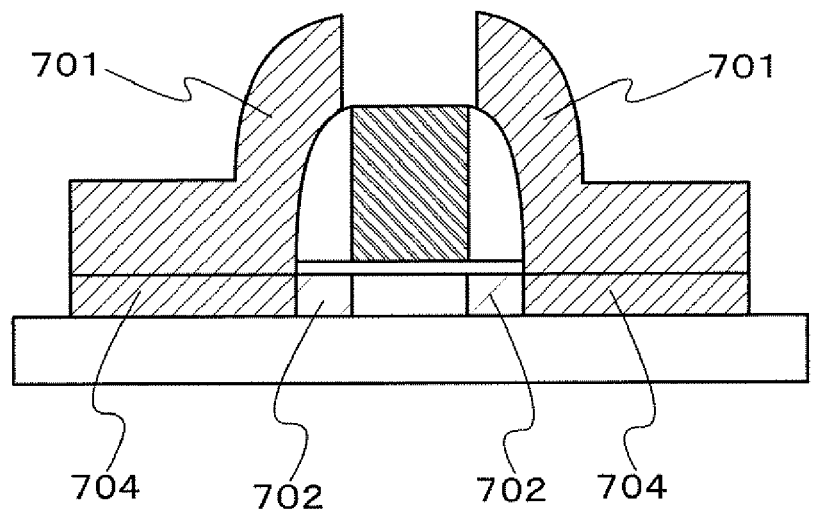
FIGS. 7A and 7B are cross-sectional views illustrating a method for manufacturing a semiconductor device in Embodiment 3.

Then, an impurity element imparting the one conductivity is added to the second semiconductor layers 603 and a portion where the first semiconductor layer 102 and the second semiconductor layers 603 are stacked to form high-concentration impurity regions 701 and 704, and low-concentration impurity regions 702 are formed between the high-concentration impurity regions and the channel formation region (FIG. 7A).

In this process, the impurity element may be added so that the low-concentration impurity regions remain at lower portions in regions which are in the first semiconductor layer 102 and overlapped with the second semiconductor layers 603 (corresponding to regions 704 shown in FIG. 7A) to form lamination of the low-concentration impurity regions and the high-concentration impurity regions in the first semiconductor layer 102. In this case, the low-concentration impurity regions are also formed at lower portions in the regions which are in the first semiconductor layer 102 and overlapped with the second semiconductor layers 603. With functions of these low-concentration impurity regions, leakage current of a transistor can be reduced.

The impurity element which is added here may be either an element imparting p-type conductivity or an element imparting n-type conductivity; however, an element imparting the same conductivity as conductivity of the low-concentration impurity regions 702 should be added. Further, addition is performed so that an impurity concentration of the high-concentration impurity regions 701 is higher than that of the low-concentration impurity regions 702.

In this embodiment, the impurity element is added after the second semiconductor layers 603 are formed; however, a process may be employed in which addition is performed at the stage where the semiconductor film 601 is formed (FIG. 6A) to form the high-concentration impurity regions and then patterning is performed to form the second semiconductor layers 603.

As the impurity element imparting n-type conductivity, phosphorus, arsenic, or the like can be used. As the impurity element imparting p-type conductivity, boron or the like can be used. The impurity element can be added by ion doping, ion implantation, laser doping, a thermal diffusion method, or the like.

Then, the impurity element which is added is activated with heat or irradiation with light (with laser, infrared rays, or the like).

The high-concentration impurity regions 701 and 704 which are formed function as a source region and a drain region of a thin film transistor.

Figure 7B:
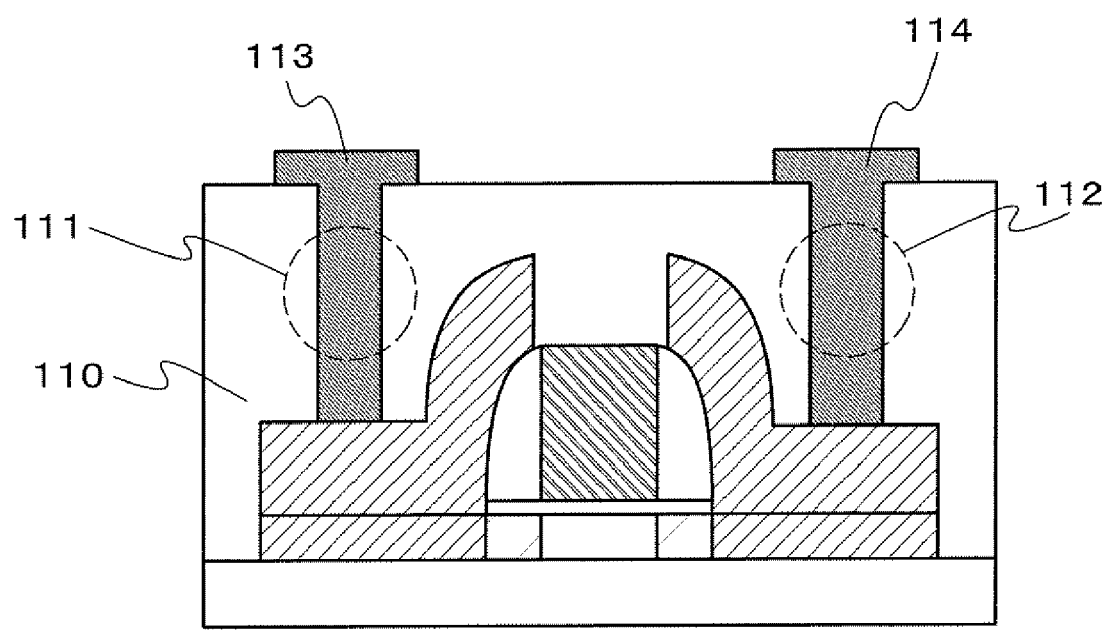

Subsequently, the interlayer insulating films 110 which have a single-layer structure or a stacked-layer structure are formed. Then, the electrodes 113 and 114 are electrically connected to the high-concentration impurity regions 701 and 704 through the contact holes 111 and 112, which are provided in the interlayer insulating films 110 (FIG. 7B).

A structure may be employed in which regions comprising metal silicide are formed over the high-concentration impurity regions 701 and the electrodes 113 and 114 are electrically connected to the regions comprising metal silicide in order to reduce sheet resistance of the source region and the drain region.

As described above, a semiconductor device is manufactured using the first method.

Embodiment 4

In Embodiment 4, a second method for manufacturing a semiconductor device is described with reference to FIGS. 8A to 8C and FIGS. 9A and 9B.

As in Embodiment 3, the insulator 101, the first semiconductor layer 102, the insulating film 501 which is to be a gate insulating film, and a conductive film 801 which is to be a gate electrode are formed in this order.

Figure 8A:
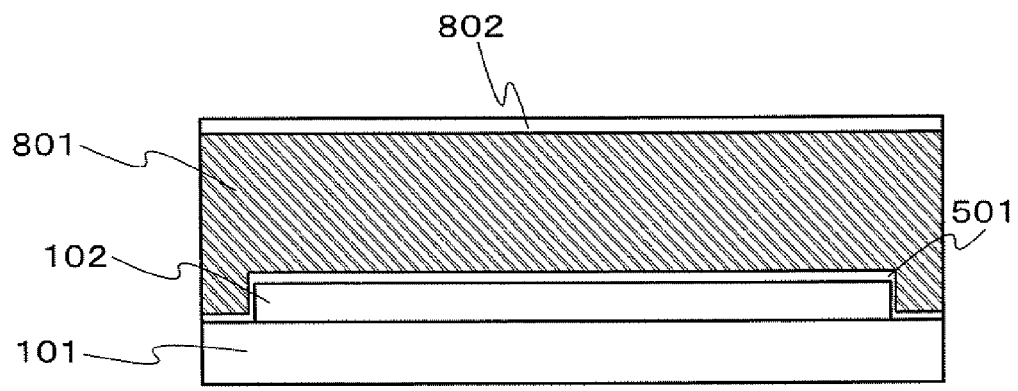
FIGS. 8A to 8C are cross-sectional views illustrating a method for manufacturing a semiconductor device in Embodiment 4.

Next, an insulating film 802 is formed over the conductive film 801 which is to be a gate electrode (FIG. 8A).

Figure 8B:
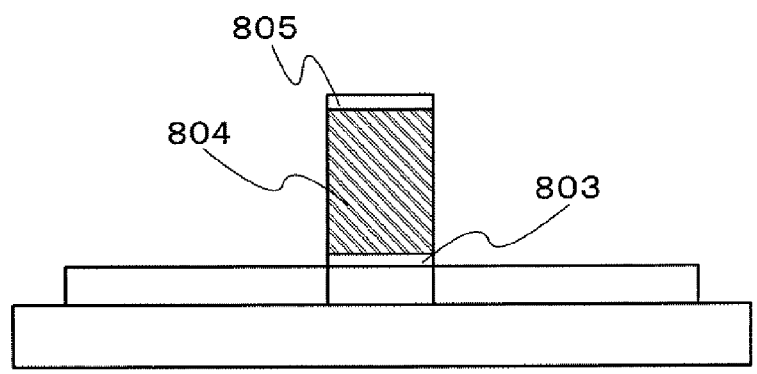

Then, the insulating film 501, the conductive film 801, and the insulating film 802 are etched using a mask (not illustrated) to form a gate insulating film 803, a gate electrode 804, and an insulating layer 805 covering a top surface of the gate electrode 804 (FIG. 8B).

In the case where an LDD region is formed, the impurity element is added at low concentration as in Embodiment 3. Addition may be performed at this stage or performed through the insulating film 501 after only the gate electrode 804 and the insulating layer 805 which is on a top surface of the gate electrode 804 are etched without etching the insulating film 501. In the case where the impurity element is added through the insulating film, in forming sidewalls in a later process step, it is desirable that the insulating film 501 is etched to form a gate insulating film. Note that, in the case where an LDD region is not formed, an impurity element may be added at high concentration.

Figure 8C:
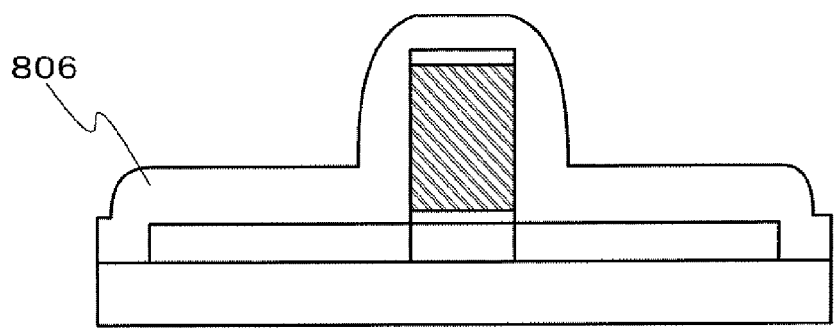

Next, an insulating film 806 which is to be sidewalls is formed (FIG. 8C).

Figure 9A:
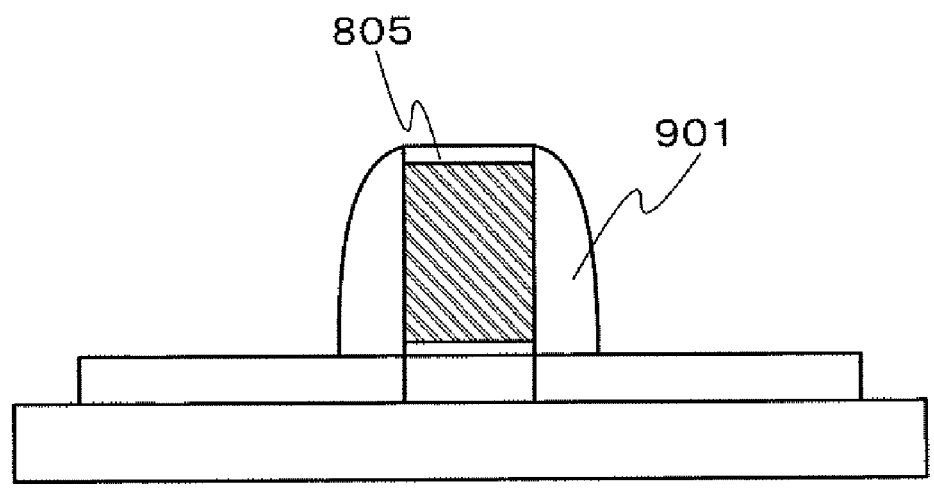
FIGS. 9A and 9B are cross-sectional views illustrating a method for manufacturing a semiconductor device in Embodiment 4.

Then, sidewalls 901 which cover side surfaces of the gate electrode 804 are formed by etching back the insulating film 806. At this time, since the insulating layer 805 serves as an etching stopper in etching back, the top surface of the gate electrode 804 can be prevented from being exposed and damaged. Therefore, the insulating layer 805 is preferably formed using a material of which the etching rate with respect to that of the sidewalls is low. In the case where the gate insulating film is formed at this stage, the insulating layer 805 is preferably formed using a material of which the etching rate with respect to that of the gate insulating film is also low (FIG. 9A).

Figure 9B:
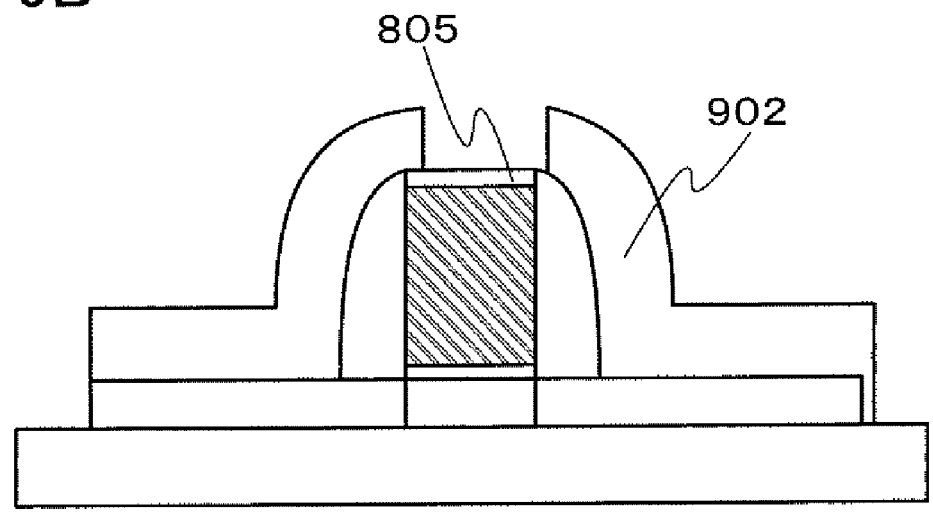

Next, as in Embodiment 3, a semiconductor film (not illustrated) which covers the sidewalls 901, the first semiconductor layer 102, and the insulator 101 and which is to be second semiconductor layers is formed. Then, the semiconductor film is patterned to form two second semiconductor layers 902 which are in contact with the first semiconductor layer 102. The second semiconductor layers 902 should be formed partially covering the sidewalls 901, and since the sidewalls 901 are partially covered, the top surface of the first semiconductor layer 102 can be prevented from being exposed between the sidewalls 901 and the second semiconductor layers 902 and being removed in patterning the second semiconductor layers 902 (FIG. 9B).

In this embodiment, since the insulating layer 805 is formed on the top surface of the gate electrode 804, even when the second semiconductor layers 902 are formed at positions which overlap with the gate electrode 804, a short circuit between the second semiconductor layers 902 and the gate electrode 804 can be prevented.

Formation of the high-concentration impurity regions and subsequent process steps are similar to those in Embodiment 3 (process steps after FIG. 7A); therefore, a description thereof is omitted.

Embodiment 5

In Embodiment 5, a third method for manufacturing a semiconductor device is described with reference to FIGS. 10A to 10C and FIGS. 11A to 11C.

Since process steps to and including formation of the insulating film 502 for forming sidewalls are similar those in Embodiment 3 (FIG. 5C), in this embodiment, a description of processes from formation of sidewalls is made.

Figure 10A:
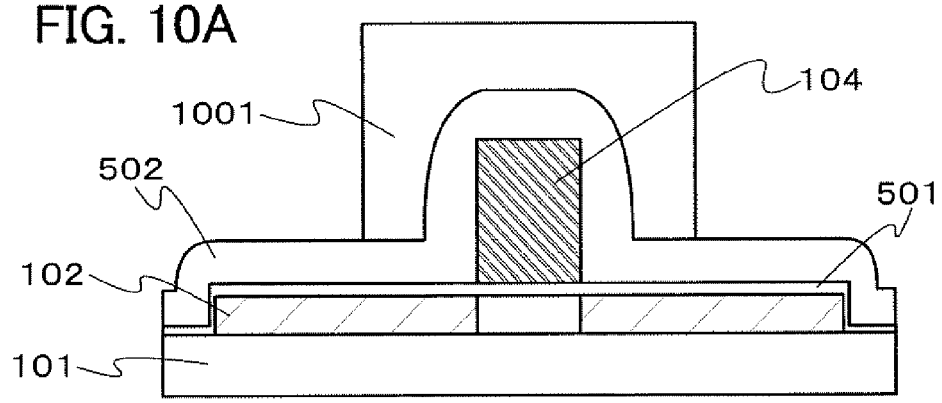
FIGS. 10A to 10C are cross-sectional views illustrating a method for manufacturing a semiconductor device in Embodiment 5.

After the insulating film 502 is formed, a resist mask 1001 is formed covering the gate electrode 104 (FIG. 10A).

Figure 10B:
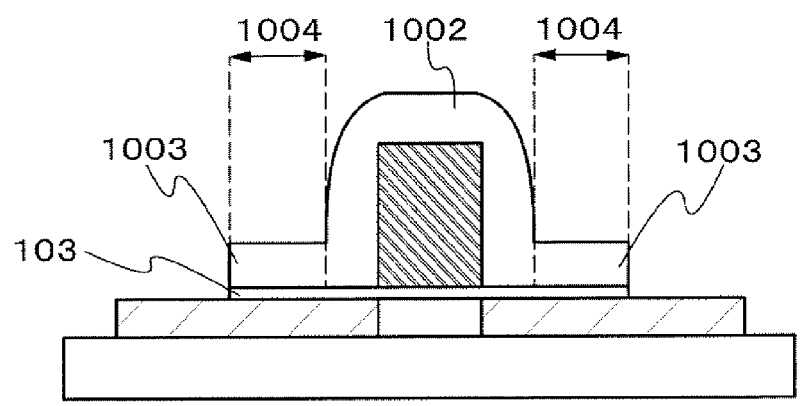

The insulating film 502 is etched using the resist mask 1001, and a sidewall 1002 and end portions 1003 of the sidewall 1002 which extend over the first semiconductor layer 102 are formed. The end portions 1003 have widths 1004 (FIG. 10B).

As in Embodiment 3, the gate insulating film 103 may be formed at this stage or at the same time as formation of the gate electrode 104.

Figure 10C:
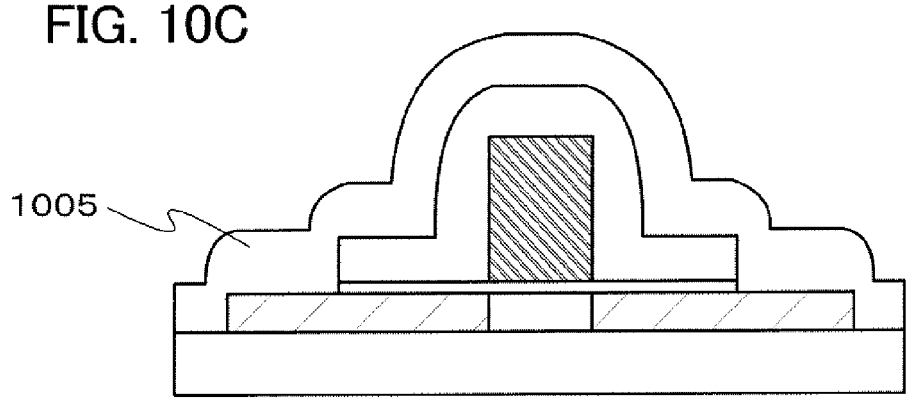

Then, the resist mask 1001 is removed, and a semiconductor film 1005 which covers the sidewall 1002, the end portions 1003, the first semiconductor layer 102, and the insulator 101 and which is to be second semiconductor layers is formed (FIG. 10C).

The thickness of the semiconductor film 1005 should be so large that sheet resistance of portions to be a source region and a drain region can be reduced, and the thickness is preferably greater than or equal to 50 nm (desirably, greater than or equal to 100 nm).

Figure 11A:
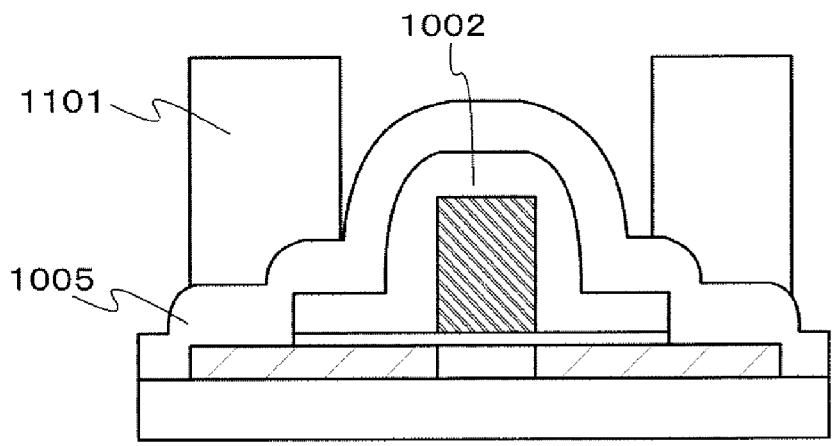
FIGS. 11A to 11C are cross-sectional views illustrating a method for manufacturing a semiconductor device in Embodiment 5.
Figure 11B:
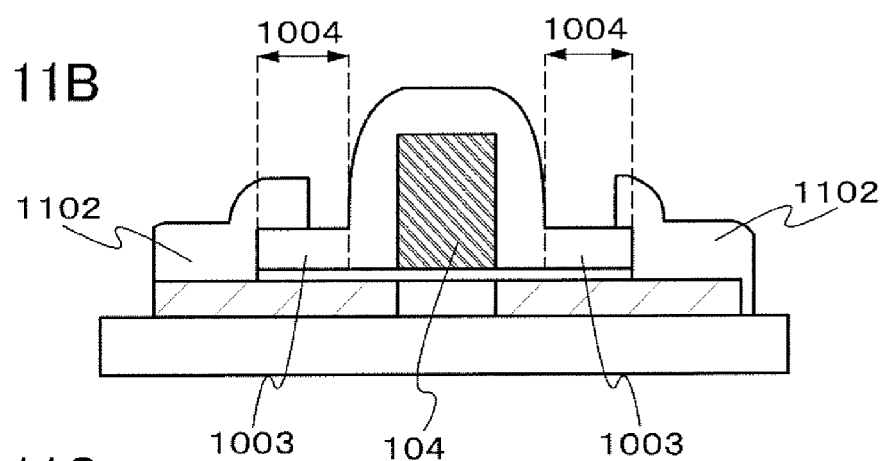

Then, the semiconductor film 1005 is etched using the resist mask 1101 to expose the sidewall 1002 and to form two second semiconductor layers 1102 which cover at least a part of the end portions 1003 and are in contact with and stacked over the first semiconductor layer 102 (FIGS. 11A and 11B).

Here, as illustrated in FIG. 11B, the second semiconductor layers 1102 should be formed covering at least a part of the end portions 1003. By forming the second semiconductor layers 1102 so that the end portions 1003 are partially covered, the end portions 1003 serve as etching stoppers, and the top surface of the first semiconductor layer 102 is not exposed between the end portions 1003 of the sidewall and the second semiconductor layers 1102 in patterning the second semiconductor layers 1102. Therefore, the first semiconductor layer 102 can be prevented from being removed in the patterning.

Note that end portions of the second semiconductor layers 1102 and end portions of the first semiconductor layer 102 do not have to be aligned with each other.

By providing the end portions 1003, even in the case where the second semiconductor layers 1102 are formed not covering the sidewall 1002 due to misalignment of the resist mask 1101, a margin of the widths 1004 can be obtained, and redundancy of alignment can be improved.

Further, by providing the end portions 1003, a distance can be put between the second semiconductor layers 1102 and the gate electrode 104; therefore, parasitic capacitance between the second semiconductor layers 1102 and the gate electrode 104 can be reduced.

Figure 11C:
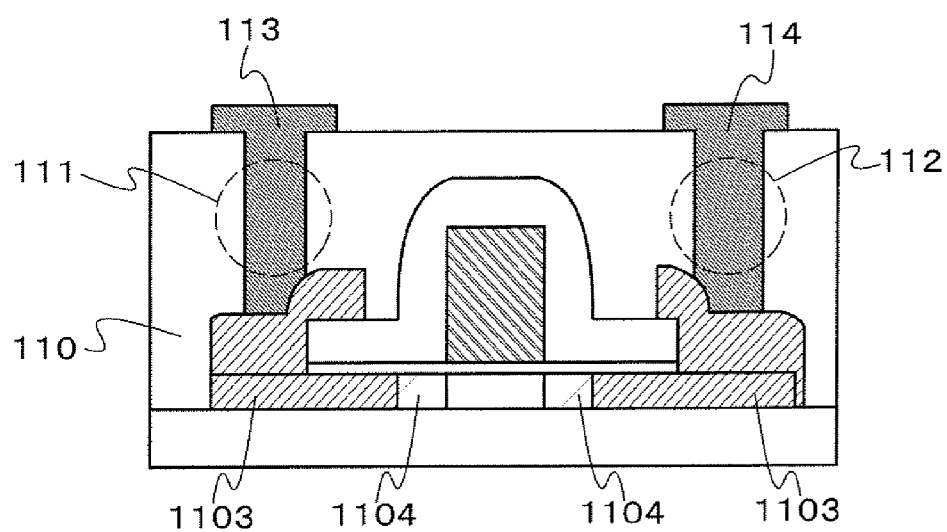

Then, by adding an impurity element imparting one conductivity, high-concentration impurity regions 1103 are formed at portions where the first semiconductor layer 102 and the second semiconductor layers 1102 overlap with each other, and low-concentration impurity regions 1104 are formed. Here, the impurity element is added which imparts the same conductivity as the conductivity of the low-concentration impurity regions 1104 and has higher concentration than the low-concentration impurity regions 1104. In this case, the impurity element is added to the first semiconductor layer 102 through the end portions 1003; thus, portions which are in the first semiconductor layer 102 and overlap with the end portions 1003 also serve as the high-concentration impurity regions 1103 (FIG. 11C).

Further, by thickly forming the end portions 1003, the end portions 1003 serve as masks in the addition of the impurity element; therefore, the low-concentration impurity regions 1104 can also be formed at portions which are in the first semiconductor layer 102 and overlap with the end portions 1003.

Furthermore, the thickness of the end portions 1003 or conditions for addition of an impurity element is controlled so that a part of the impurity element passes through the end portions 1003; thus, impurity regions whose impurity concentration is higher than that of the low-concentration impurity regions and lower than that of the high-concentration impurity regions can be formed at portions which are in the first semiconductor layer 102 and between the low-concentration impurity regions 1104 and the high-concentration impurity regions 1103 and which overlap with the end portions 11003.

Alternatively, the impurity element may be added so that the low-concentration impurity regions remain at portions which are in the first semiconductor layer 102 and overlap with the semiconductor layers 1102, and a staked-layer structure of the low-concentration impurity regions and the high-concentration impurity regions may be formed in the first semiconductor layer 102.

Note that, in this embodiment, although the impurity element is added after the second semiconductor layers 1102 are formed, a process may be employed in which the impurity element is added at the stage where the semiconductor film 1005 is formed (FIG. 10C) to form the high-concentration impurity regions and then the second semiconductor layers 1102 are formed.

Next, the impurity element which is added is activated with heat or irradiation with light (with laser, infrared rays, or the like).

Then, the high-concentration impurity regions 1103 which are formed function as a source region and a drain region of a thin film transistor.

Subsequently, the interlayer insulating films 110 having a single-layer structure or a stacked-layer structure are formed. The electrodes 113 and 114 are electrically connected to the high-concentration impurity regions 1103 through the contact holes 111 and 112, which are provided in the interlayer insulating films 110 (FIG. 11C).

A structure may be employed in which regions comprising metal silicide are formed over the high-concentration impurity regions 1103 and the electrodes 113 and 114 are electrically connected to the regions comprising metal silicide in order to reduce resistance of the source region and the drain region.

Embodiment 6

Figure 12A:
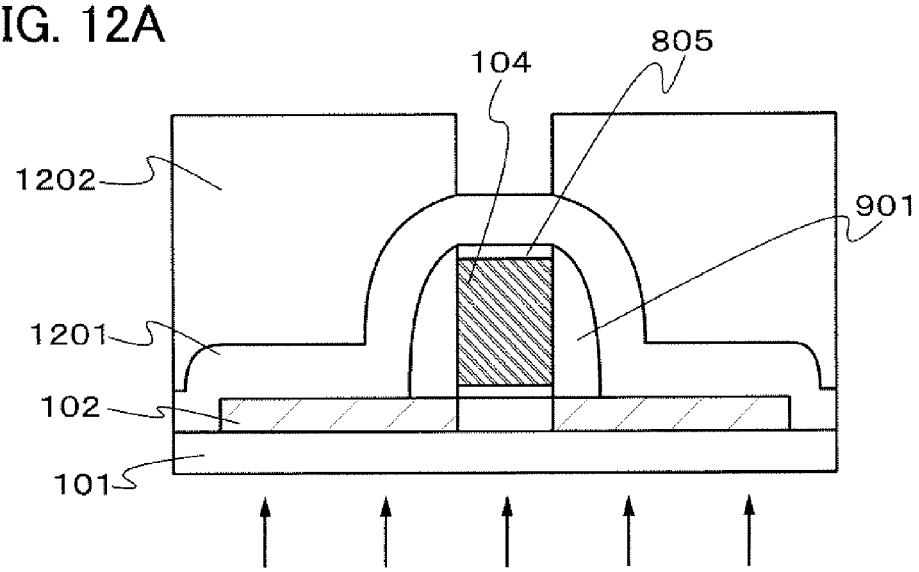
FIGS. 12A to 12C are cross-sectional views illustrating a method for manufacturing a semiconductor device in Embodiment 6.

In Embodiment 6, a fourth method for manufacturing a semiconductor device is described with reference to FIGS. 12A to 12C.

Since process steps to and including formation of the sidewalls 901 are similar to those in Embodiment 4 (FIG. 9A), a description thereof is omitted.

After the sidewalls 901, the insulating layer 805, the first semiconductor layer 102, and a semiconductor film 1201 which covers the insulator 1101 and is to be second semiconductor layers are formed, a negative resist is formed over the semiconductor film 1201, and light exposure (backside light exposure) is carried out from the insulator 101 side to the negative resist. Then, development is carried out to process the negative resist into a desired shape (FIG. 12A).

By carrying out backside light exposure, the gate electrode 104 can be used as a mask; therefore, it is not necessary to use a new mask, and it is possible to achieve reductions in the number of process steps and cost.

Note that, for carrying out backside light exposure, it is important to use a light-transmitting substrate and irradiate the negative resist with energy required for light exposure.

Figure 12B:
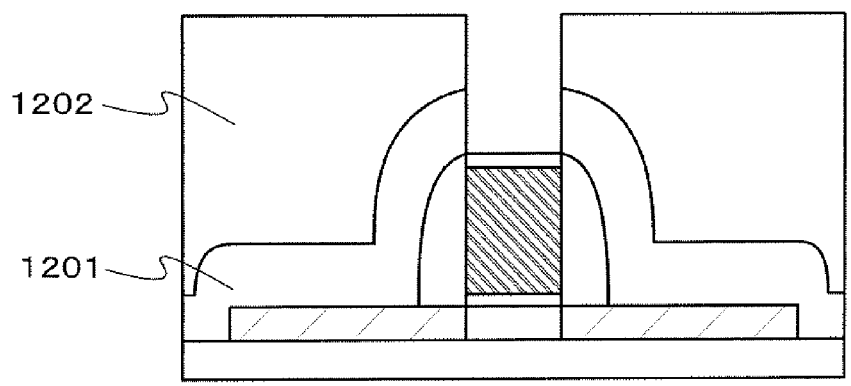

Then, the semiconductor film 1201 is etched using resist masks 1202 which are processed so that the semiconductor film 1201 is divided over the sidewalls 901 (FIG. 12B).

Figure 12C:
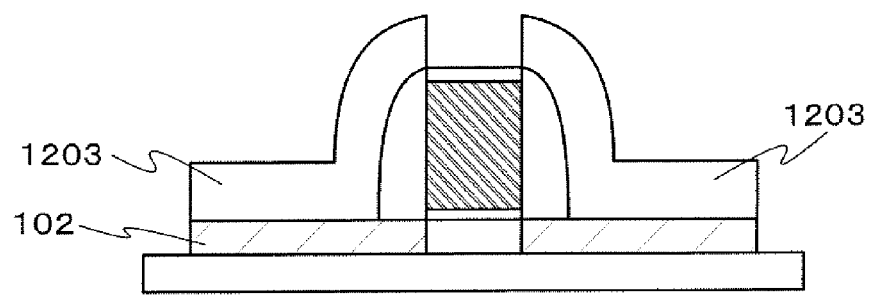

Then, end portions of the semiconductor film 1201 are etched to form two second semiconductor layers 1203 which are stacked over the first semiconductor layer 102 (FIG. 12C).

The second semiconductor layers 1203 are formed using as a mask a resist which is formed by backside light exposure using the gate electrode 104 as a mask. Therefore, the second semiconductor layers 1203 can be formed so as to overlap parts of the sidewalls 901. As a result, as in Embodiment 3, the first semiconductor layer 102 can be prevented from being removed.

The following process steps are similar to those in Embodiment 3 (process steps after FIG. 7A); therefore, a description thereof is omitted Embodiment 7

In this embodiment examples of electronic devices manufactured using a semiconductor device which is disclosed are described.

A semiconductor device which is disclosed can be applied to a pixel portion, a driver circuit portion, or the like of a display device provided with an organic light emitting element, an inorganic light emitting element, a liquid crystal element, or the like.

Further, an electronic device provided with a memory medium, such as a digital camera, a car navigation system, a notebook personal computers a game machine, a portable information terminal (e.g., a portable telephone or a portable game machine), or a home game machine, can be manufactured using the semiconductor device which is disclosed.

Furthermore, the semiconductor device which is disclosed can be applied to an integrated circuit of a CPU (a central processing unit) or the like.

Figure 13A:
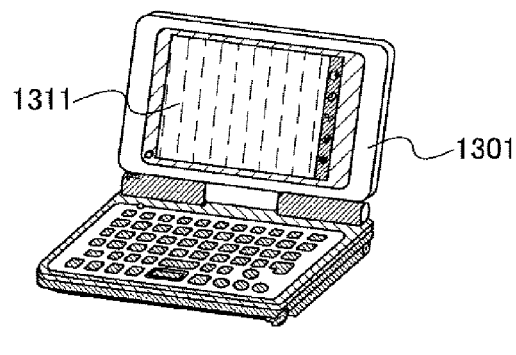
FIGS. 13A to 13E illustrate examples of electronic devices.
Figure 13B:
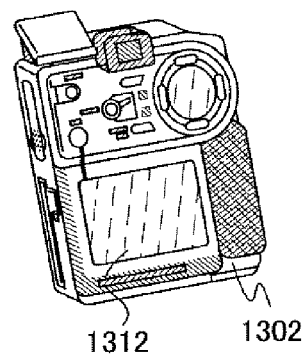
Figure 13C:
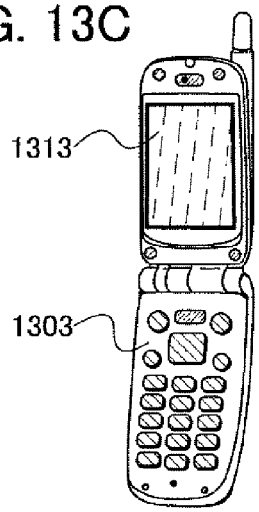
Figure 13D:
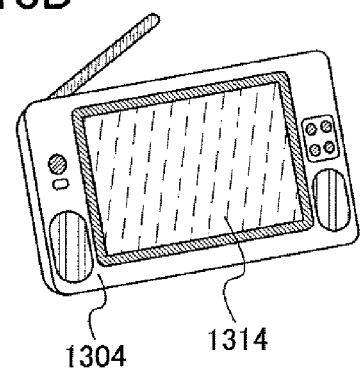
Figure 13E:
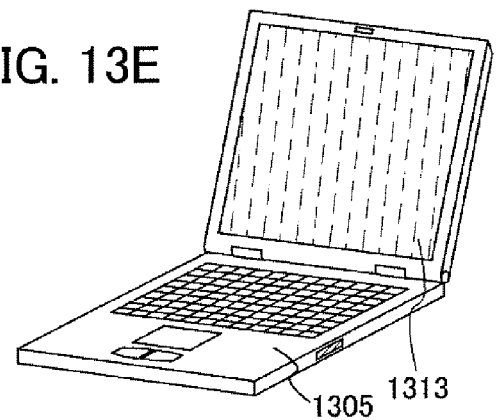
Figure 14A:
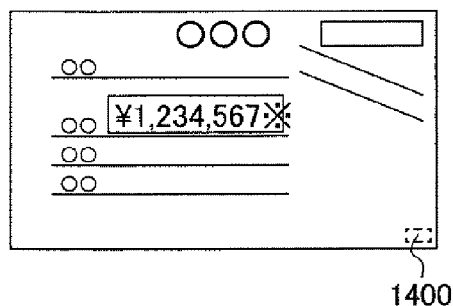
FIGS. 14A to 14H illustrate examples of contactless tags.
Figure 14B:
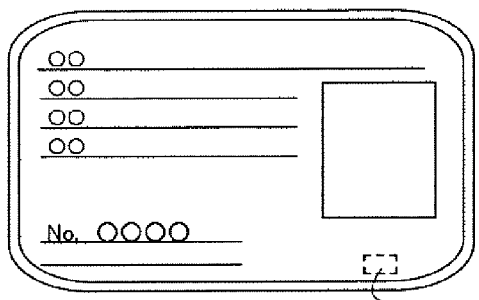
Figure 14C:
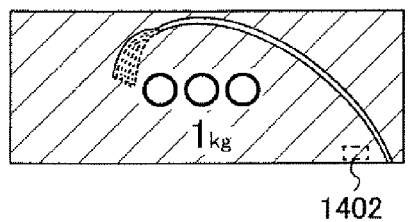
Figure 14D:
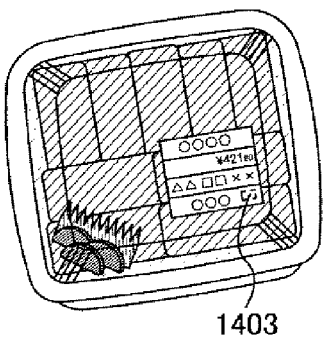
Figure 14E:
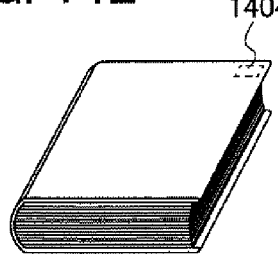
Figure 14F:
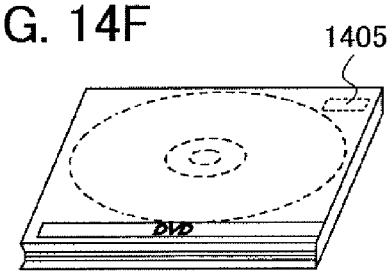
Figure 14G:
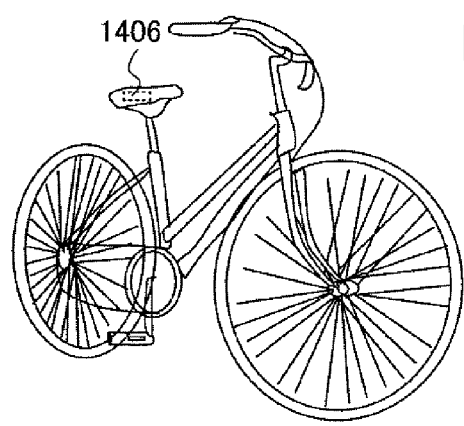
Figure 14H:
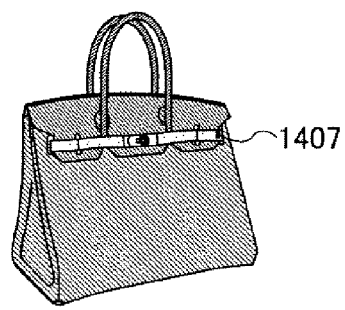

For example, FIG. 13A shows a portable information terminal. FIG. 13B shows a digital camera. FIG. 13C shows a portable telephone. FIG. 13D shows a car navigation system. FIG. 13E shows a notebook personal computer. The semiconductor device which is disclosed can be applied to an integrated circuit incorporated in main bodies 1301, 1302, 1303, 1304, and 1305, or display portions 1311, 1312, 1313, 1314, and 1315 of the devices.

In manufacturing a display device, it is preferable to employ the first, second, third, or fourth method and use a glass substrate which is inexpensive and does not have a limit on the size of the substrate.

Furthermore, the semiconductor device which is disclosed can be applied to a device which enables non-contact input and output of data. The device capable of inputting and outputting data without contact is also referred to as an RFID tag, an ID tag, an IC tag, an IC chip, an RF tag, a wireless tag, an electronic tag, or a wireless chip They are generically called non-contact tags (non-contact chips).

For example, the semiconductor device which is disclosed can be applied to non-contact tags 1400, 1401, 1402, 1403, 1404, 1405, 1406, and 1407 in FIGS. 14A to 14H.

This application is based on Japanese Patent Application Serial No. 2008-115008 filed with Japan Patent Office on Apr. 25, 2008, the entire contents of which are hereby incorporated by reference.

What is claimed is:

1. A semiconductor device comprising:
a first semiconductor layer comprising high-concentration impurity regions formed over an insulator;
a gate insulating film formed over the first semiconductor layer;
a gate electrode formed over the gate insulating film;
a sidewall comprising a first portion and a second portion which is in contact with side surfaces of the gate electrode;
second semiconductor layers which are in contact with and stacked over the first semiconductor layer and which are formed to cover at least a part of the sidewall;
an interlayer insulating film in contact with the second semiconductor layers; and
electrodes on and in contact with the interlayer insulating film which are electrically connected to the second semiconductor layers,
wherein the first portion is over the first semiconductor layer, and
wherein the second portion overlaps with at least one of the high-concentration impurity regions.

2. The semiconductor device according to claim 1, wherein a top surface of the gate insulating film is in contact with the sidewall.

3. The semiconductor device according to claim 1, wherein a top surface of the first semiconductor layer is in contact with the sidewall.

4. The semiconductor device according to claim 1, wherein the high-concentration impurity regions are underneath the second semiconductor layers.

5. An electronic device comprising a semiconductor device according to claim 1.

6. The semiconductor device according to claim 1, wherein the high-concentration impurity regions act as a source and a drain.

7. A semiconductor device comprising:
a first semiconductor layer over an insulator, the first semiconductor layer comprising at least a channel formation region, low-concentration impurity regions, and first high-concentration impurity regions;
a gate insulating film over the first semiconductor layer;
a gate electrode over the gate insulating film;
a sidewall comprising a first portion and a second portion which is in contact with side surfaces of the gate electrode;
second semiconductor layers being in contact with and stacked over the first semiconductor layer and covering at least a part of the end portions of the sidewall, the second semiconductor layers having second high-concentration impurity regions;
an interlayer insulating film in contact with the second semiconductor layers; and
electrodes on and in contact with the interlayer insulating film which are electrically connected to the second semiconductor layers,
wherein the channel formation region overlaps with the gate electrode and the low-concentration impurity regions overlap with the sidewalls,
wherein the first portion is over the first semiconductor layer, and
wherein the second portion overlaps with at least one of the first high-concentration impurity regions.

8. The semiconductor device according to claim 7, wherein a top surface of the gate insulating film is in contact with the sidewall.

9. The semiconductor device according to claim 7, wherein a top surface of the first semiconductor layer is in contact with the sidewall.

10. The semiconductor device according to claim 7, wherein the first high-concentration impurity regions are underneath the second semiconductor layers.

11. An electronic device comprising a semiconductor device according to claim 7.

12. The semiconductor device according to claim 7, wherein the first high-concentration impurity regions and the second high-concentration impurity regions act as a source and a drain.

13. A method for manufacturing a semiconductor device comprising the steps of:
forming a first semiconductor layer over an insulator;
forming a gate insulating film and a gate electrode which are stacked over the first semiconductor layer in this order;

adding an impurity element imparting one conductivity to the first semiconductor layer using the gate electrode as a mask to form low-concentration impurity regions in the first semiconductor layer;

forming a sidewall which is in contact with side surfaces of the gate electrode and of which end portions are extended over the first semiconductor layer;

forming a semiconductor film covering the gate electrode, the sidewall, the end portions of the sidewall, and the first semiconductor layer;

etching the semiconductor film using a resist mask to form two second semiconductor layers so that the second semiconductor layers are in contact with and stacked over the first semiconductor layer and are in contact with or cover at least a part of the end portions; and adding an impurity element imparting the one conductivity to form high-concentration impurity regions in the first semiconductor layer and the second semiconductor layers.

14. The method for manufacturing a semiconductor device according to claim 13, wherein a bottom surface of the sidewall is in contact with the gate insulating film.

15. The method for manufacturing a semiconductor device according to claim 13, wherein a bottom surface of the sidewall is in contact with the first semiconductor layer.

16. The method for manufacturing a semiconductor device according to claim 13, wherein the high-concentration impurity regions in the first semiconductor layer are formed underneath the second semiconductor layers.

17. The method for manufacturing a semiconductor device according to claim 13, wherein the high-concentration impurity regions act as a source and a drain.

18. A method for manufacturing a semiconductor device comprising the steps of:

forming a first semiconductor layer over an insulator;

forming a gate insulating film, a gate electrode, and an insulating layer which are stacked over the first semiconductor layer in this order;

adding an impurity element imparting one conductivity to the first semiconductor layer using the gate electrode as a mask to form low-concentration impurity regions in the first semiconductor layer;

forming sidewalls on side surfaces of the gate electrode;

forming a semiconductor film covering the insulating layer, the sidewalls, and the first semiconductor layer;

forming a negative resist covering the semiconductor film;

forming a resist mask by performing light exposure from a rear surface side of the insulator to the negative resist using the gate electrode as a mask;

etching the semiconductor film using the resist mask;

patterning the semiconductor film which is etched to form two second semiconductor layers so that the second semiconductor layers are in contact with and stacked over the first semiconductor layer and are in contact with or cover a part of the sidewalls; and adding an impurity element imparting the one conductivity to form high-concentration impurity regions in at least the second semiconductor layers.

19. The method for manufacturing a semiconductor device according to claim 18, wherein bottom surfaces of the sidewalls are in contact with the gate insulating film.

20. The method for manufacturing a semiconductor device according to claim 18, wherein bottom surfaces of the sidewalls are in contact with the first semiconductor layer.

21. The method for manufacturing a semiconductor device according to claim 18, the first semiconductor layer is added with the impurity element imparting the one conductivity so that high-concentration impurity regions are also formed in the first semiconductor layer underneath the second semiconductor layers.

22. The method for manufacturing a semiconductor device according to claim 18, wherein the high-concentration impurity regions act as a source and a drain.

* * * * *